(12) United States Patent
Li et al.

(10) Patent No.: US 10,708,807 B2
(45) Date of Patent: Jul. 7, 2020

(54) RESOURCE ALLOCATION FOR TRAFFIC-PROFILE-DEPENDENT SCHEDULING REQUEST

(71) Applicant: QUALCOMM Incorporated, San Diego, CA (US)

(72) Inventors: Chong Li, Weehawken, NJ (US); Junyi Li, Chester, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/584,552

(22) Filed: May 2, 2017

(65) Prior Publication Data

US 2017/0325117 A1 Nov. 9, 2017

Related U.S. Application Data

(60) Provisional application No. 62/332,457, filed on May 5, 2016.

(51) Int. Cl.
| | |
|---|---|
| *H04W 28/02* | (2009.01) |
| *H05K 1/02* | (2006.01) |
| *H04W 4/70* | (2018.01) |
| *H04W 72/04* | (2009.01) |
| *H04W 72/08* | (2009.01) |

(Continued)

(52) U.S. Cl.
CPC ......... *H04W 28/0215* (2013.01); *H04W 4/70* (2018.02); *H04W 72/048* (2013.01);
(Continued)

(58) Field of Classification Search
CPC . H04W 28/0215; H04W 4/70; H04W 72/042; H04W 72/0486; H04W 72/08;
(Continued)

(56) References Cited

U.S. PATENT DOCUMENTS

| | | | |
|---|---|---|---|
| 8,477,695 B2 * | 7/2013 | Zhang | H04L 47/12 370/329 |
| 8,665,898 B2 | 3/2014 | Spinar et al. | |

(Continued)

FOREIGN PATENT DOCUMENTS

| | | |
|---|---|---|
| WO | WO-2007149729 A1 | 12/2007 |
| WO | WO-2013025139 A1 | 2/2013 |

(Continued)

OTHER PUBLICATIONS

3GPP, TS 36.213 V13.1.1 (Mar. 2016), Evolved Universal Terrestrial Radio Access (E-UTRA); Physical layer procedures. (Year: 2016).*

(Continued)

*Primary Examiner* — Oussama Roudani
(74) *Attorney, Agent, or Firm* — Patterson & Sheridan, LLP

(57) ABSTRACT

Certain aspects of the present disclosure relate to methods and apparatus for allocating resources for the transmission of scheduling requests based on UE traffic profiles. In one embodiment, a base station determines, for one or more user equipments (UEs), a type of traffic to be exchanged between the one or more UEs and the base station. The base station allocates resources for the one or more UEs to use for sending a scheduling request based, at least in part, on the type of traffic associated with each of the one or more UEs. The base station signals an indication of the allocated resources to each of the one or more UEs.

24 Claims, 10 Drawing Sheets

(51) Int. Cl.
  *H01P 1/203* (2006.01)
  *H01P 3/02* (2006.01)
  *H01Q 1/24* (2006.01)

(52) U.S. Cl.
  CPC ........ *H04W 72/0486* (2013.01); *H04W 72/08* (2013.01); *H05K 1/0253* (2013.01); *H01P 1/2039* (2013.01); *H01P 3/026* (2013.01); *H01Q 1/246* (2013.01); *H04W 72/042* (2013.01); *H04W 72/0413* (2013.01); *H05K 1/0219* (2013.01); *H05K 1/0227* (2013.01); *H05K 1/0245* (2013.01); *H05K 2201/09309* (2013.01); *H05K 2201/09363* (2013.01); *H05K 2201/09618* (2013.01); *H05K 2201/09672* (2013.01); *H05K 2201/09781* (2013.01)

(58) Field of Classification Search
  CPC ........... H04W 72/048; H04W 72/1289; H04W 72/0413
  See application file for complete search history.

(56) References Cited

U.S. PATENT DOCUMENTS

| | | | |
|---|---|---|---|
| 8,908,511 B2 | 12/2014 | Andreozzi et al. | |
| 9,100,953 B2 | 8/2015 | Wu et al. | |
| 9,113,486 B2 | 8/2015 | Payette et al. | |
| 2012/0218942 A1* | 8/2012 | Lu | H04W 28/06 370/328 |
| 2013/0250828 A1* | 9/2013 | Chou | H04W 72/0413 370/311 |
| 2015/0078231 A1* | 3/2015 | Bergstrom | H04W 72/1242 370/311 |
| 2015/0092702 A1* | 4/2015 | Chen | H04W 72/082 370/329 |
| 2016/0227560 A1 | 8/2016 | Webb et al. | |
| 2017/0164377 A1* | 6/2017 | Ho | H04W 16/28 |

FOREIGN PATENT DOCUMENTS

| | | |
|---|---|---|
| WO | WO-2013138983 A1 | 9/2013 |
| WO | WO-2013139299 A1 | 9/2013 |
| WO | WO-2013154475 A1 | 10/2013 |

OTHER PUBLICATIONS

International Search Report and Written Opinion—PCT/US2017/030856—ISA/EPO—dated Aug. 9, 2017.

\* cited by examiner

RESOURCE ALLOCATION FOR TRAFFIC-PROFILE-DEPENDENT SCHEDULING REQUEST

CROSS-REFERENCE TO RELATED APPLICATIONS

This application claims the benefit of U.S. Provisional Patent Application Ser. No. 62/332,457, filed May 5, 2016, which is assigned to the assignee hereof and hereby expressly incorporated by reference herein.

BACKGROUND

I. Field of the Disclosure

The present disclosure relates generally to communication systems, and more particularly, to methods and apparatus for allocating resources for the transmission of scheduling requests based on traffic profile(s) associated with the device transmitting the scheduling request.

II. Description of Related Art

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency divisional multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example of an emerging telecommunication standard is Long Term Evolution (LTE). LTE/LTE-Advanced is a set of enhancements to the Universal Mobile Telecommunications System (UMTS) mobile standard promulgated by Third Generation Partnership Project (3GPP). It is designed to better support mobile broadband Internet access by improving spectral efficiency, lower costs, improve services, make use of new spectrum, and better integrate with other open standards using OFDMA on the downlink (DL), SC-FDMA on the uplink (UL), and multiple-input multiple-output (MIMO) antenna technology. However, as the demand for mobile broadband access continues to increase, there exists a need for further improvements in LTE technology. Preferably, these improvements should be applicable to other multi-access technologies and the telecommunication standards that employ these technologies.

SUMMARY

Certain aspects of the present disclosure provide a method of wireless communication by a base station. The method generally includes determining, for one or more user equipments (UEs), a type of traffic to be exchanged between the one or more UEs and the base station. The method also includes allocating resources for the one or more UEs to use for sending a scheduling request based, at least in part, on the type of traffic associated with each of the one or more UEs. The method further includes signaling an indication of the allocated resources to each of the one or more UEs.

Certain aspects of the present disclosure provide an apparatus for wireless communication. The apparatus includes at least one processor and a memory coupled to the at least one processor. The at least one processor is configured to determine, for one or more user equipments (UEs), a type of traffic to be exchanged between the one or more UEs and the apparatus. The at least one processor is also configured to allocate resources for the one or more UEs to use for sending a scheduling request based, at least in part, on the type of traffic associated with each of the one or more UEs. The at least one processor is further configured to signal an indication of the allocated resources to each of the one or more UEs.

Certain aspects of the present disclosure provide an apparatus for wireless communication. The apparatus includes means for determining, for one or more user equipments (UEs), a type of traffic to be exchanged between the one or more UEs and the apparatus. The apparatus also includes means for allocating resources for the one or more UEs to use for sending a scheduling request based, at least in part, on the type of traffic associated with each of the one or more UEs. The apparatus further includes means for signaling an indication of the allocated resources to each of the one or more UEs.

Certain aspects of the present disclosure provide a computer-readable medium having computer executable code stored thereon. The computer executable code generally includes code for determining, by an apparatus, for one or more user equipments (UEs), a type of traffic to be exchanged between the one or more UEs and the apparatus. The computer executable code also includes code for allocating, by the apparatus, resources for the one or more UEs to use for sending a scheduling request based, at least in part, on the type of traffic associated with each of the one or more UEs. The computer executable code further includes code for signaling, by the apparatus, an indication of the allocated resources to each of the one or more UEs.

Certain aspects of the present disclosure provide a method of wireless communication by a user equipment (UE). The method generally includes determining one or more resources in a control channel assigned to the UE for sending a scheduling request to a base station, wherein the one or more resources are based, in part, on a type of traffic to be exchanged between the UE and the base station. The method also includes transmitting a scheduling request in the assigned one or more resources to request resources for an uplink transmission.

Certain aspects of the present disclosure provide an apparatus for wireless communication. The apparatus includes at least one processor and a memory coupled to the at least one processor. The at least one processor is configured to determine one or more resources in a control channel assigned to the apparatus for sending a scheduling request to a base station, wherein the one or more resources are based, in part, on a type of traffic to be exchanged between the apparatus and the base station. The at least one processor is also configured to transmit a scheduling request in the assigned one or more resources to request resources for an uplink transmission.

Certain aspects of the present disclosure provide an apparatus for wireless communication. The apparatus includes means for determining one or more resources in a control channel assigned to the apparatus for sending a scheduling request to a base station, wherein the one or more resources are based, in part, on a type of traffic to be exchanged between the apparatus and the base station. The apparatus also includes means for transmitting a scheduling request in the assigned one or more resources to request resources for an uplink transmission.

Certain aspects of the present disclosure provide a computer-readable medium having computer executable code stored thereon. The computer executable code generally includes code for determining, by an apparatus, one or more resources in a control channel assigned to the apparatus for sending a scheduling request to a base station, wherein the one or more resources are based, in part, on a type of traffic to be exchanged between the apparatus and the base station. The computer executable code also includes code for transmitting, by the apparatus, a scheduling request in the assigned one or more resources to request resources for an uplink transmission.

Numerous other aspects are provided including methods, apparatus, systems, computer program products, computer-readable medium, and processing systems. To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
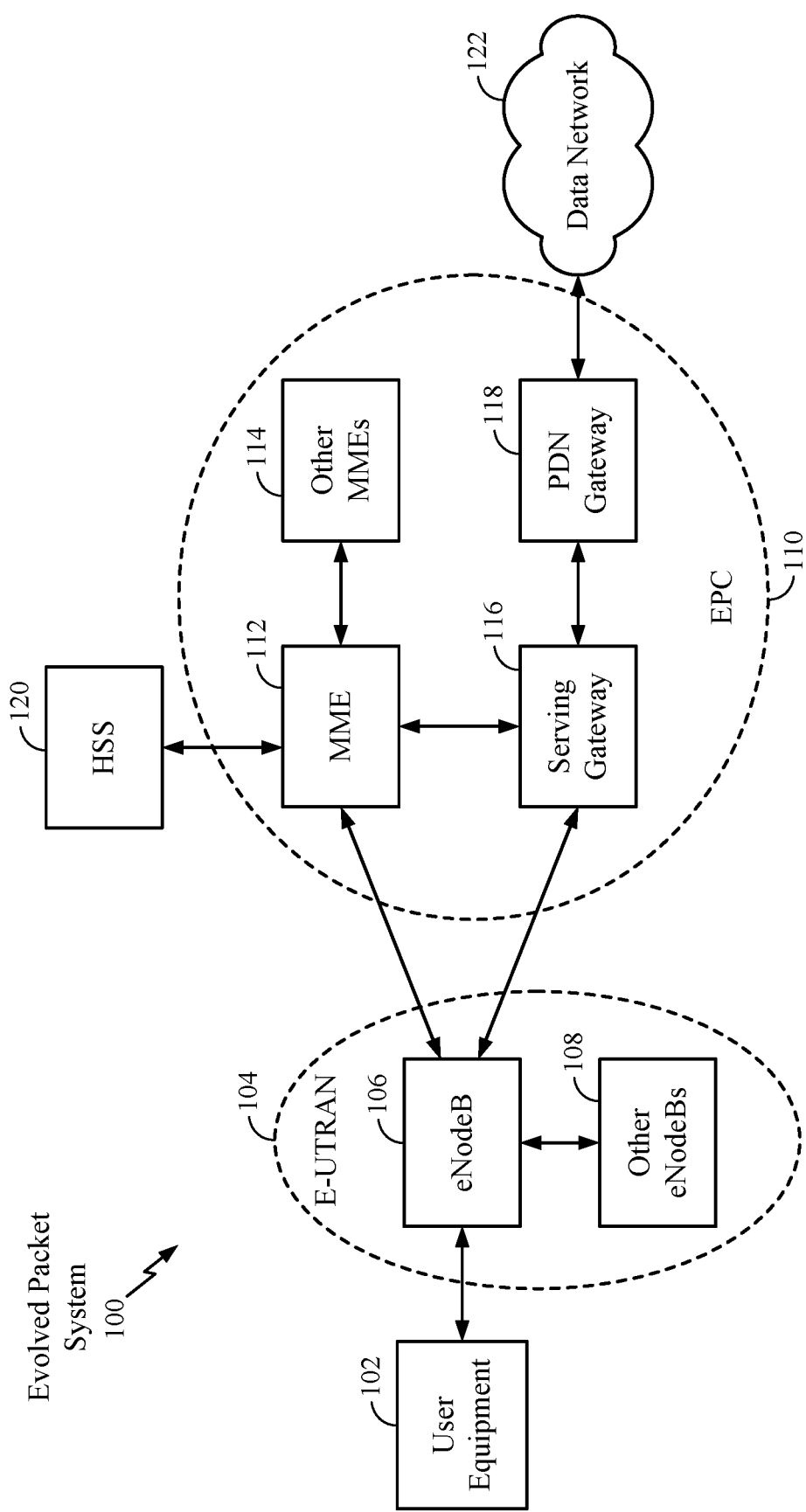
FIG. 1 is a diagram illustrating an example of a network architecture, in accordance with certain aspects of the disclosure.

Aspects of the present disclosure provide techniques and apparatus for allocating resources for devices to transmit scheduling requests, based on a traffic profile (or type of traffic) associated with the devices.

For example, as described in more detail below, a base station (e.g., eNB, gNB, etc.) may determine a type of traffic (e.g., voice traffic, video traffic, texting traffic, mission critical (high reliability, low latency) traffic, etc.) that is to be exchanged between one or more user equipments (UEs) and the base station. The base station may allocate (or assign) resources in a control channel to each UE to use to send a scheduling request based, in part, on the determined type of traffic associated with each UE. The scheduling request requests resources for an uplink transmission, and may be sent, for example, when the UEs have uplink data to transmit. Once assigned, the base station may signal an indication of the allocated resources to each UE.

Each UE may use the assigned resources to transmit additional information (e.g., information in addition to a scheduling request indicator) regarding the uplink transmission in the scheduling request. For example, such additional information may include a buffer status of the UE, size of packets for the uplink transmission, service priority of the packets for the uplink transmission, lifetime of packets (e.g., time-to-die of each packet) for the uplink transmission, and the like. The base station can use such additional information when determining the amount of resources to assign to each UE for an uplink transmission.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using hardware, software/firmware, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software/firmware, middleware, microcode, hardware description language, or otherwise.

Accordingly, in one or more exemplary embodiments, the functions described may be implemented in hardware, software/firmware, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

FIG. 1 is a diagram illustrating an LTE network architecture 100, in which aspects presented herein may be practiced. For example, evolved Node B (eNB) 106 and/or eNB 108 may allocate resources for the UE 102 to use for sending a scheduling request. The resources allocated for the scheduling request may be based on a traffic profile associated with the UE 102 (e.g., a type of traffic to be exchanged between the UE 102 and eNB 106 or 108).

The LTE network architecture 100 may be referred to as an Evolved Packet System (EPS) 100. The EPS 100 may include one or more UEs 102, an Evolved UMTS Terrestrial Radio Access Network (E-UTRAN) 104, an Evolved Packet Core (EPC) 110, a Home Subscriber Server (HSS) 120, and an Operator's Internet Protocol (IP) Services 122. The EPS 100 can interconnect with other access networks, but for simplicity those entities/interfaces are not shown. Exemplary other access networks may include an IP Multimedia Subsystem (IMS) Packet Data Network (PDN), Internet PDN, Administrative PDN (e.g., Provisioning PDN), carrier-specific PDN, operator-specific PDN, and/or GPS PDN. As shown, the EPS 100 provides packet-switched services, however, as those skilled in the art will readily appreciate, the various concepts presented throughout this disclosure may be extended to networks providing circuit-switched services.

The E-UTRAN 104 includes the eNB 106 and other eNBs 108. The eNB 106 provides user and control plane protocol terminations toward the UE 102. The eNB 106 may be connected to the other eNBs 108 via an X2 interface (e.g., backhaul). The eNB 106 may also be referred to as a base station, a base transceiver station, a radio base station, a radio transceiver, a transceiver function, a basic service set (BSS), an extended service set (ESS), gNB, or some other suitable terminology. The eNB 106 provides an access point to the EPC 110 for a UE 102. Examples of UEs 102 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a netbook, a smart book, or any other similar functioning device. The UE 102 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

The eNB 106 is connected by an Si interface to the EPC 110. The EPC 110 includes a Mobility Management Entity (MME) 112, other MMEs 114, a Serving Gateway 116, and a Packet Data Network (PDN) Gateway 118. The MME 112 is the control node that processes the signaling between the UE 102 and the EPC 110. Generally, the MME 112 provides bearer and connection management. All user IP packets of a PDN connection are transferred through the Serving Gateway 116, which itself is connected to the PDN Gateway 118 serving the PDN connection. The PDN Gateway 118 provides UE IP address allocation as well as other functions. A PDN connection is served by one and only one PDN GW 118. The PDN Gateway 118 is connected to the Data Network 122. The Data Network 122 may include, for example, the Internet, the Intranet, an IP Multimedia Subsystem (IMS), a PS Streaming Service (PSS), or a non-IP network where transport of data is e.g. performed based on Ethernet frames. In this manner, the UE 102 may be coupled to the PDN through the LTE network via a PDN Connection.

Figure 2:
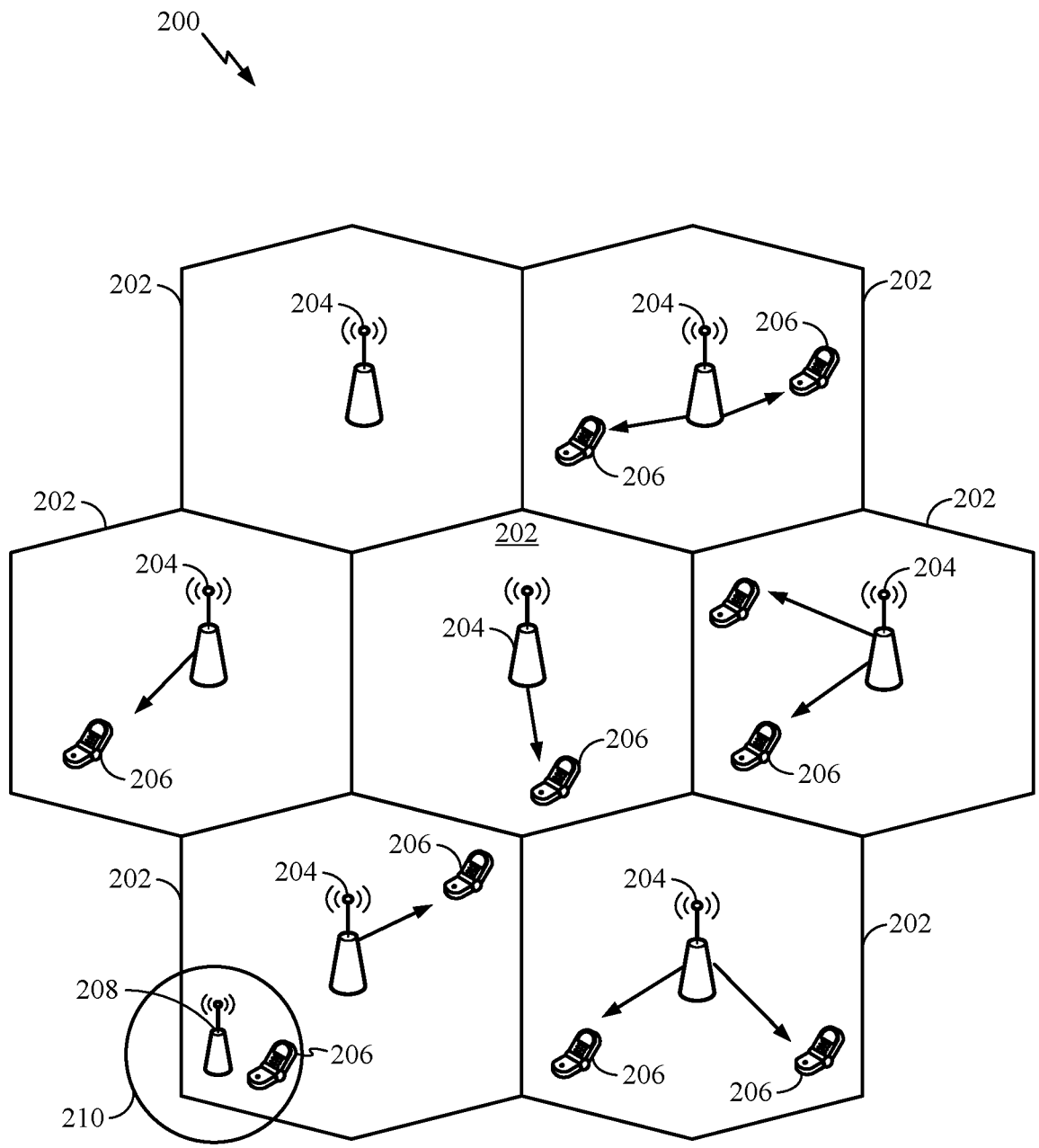
FIG. 2 is a diagram illustrating an example of an access network, in accordance with certain aspects of the disclosure.

FIG. 2 is a diagram illustrating an example of an access network 200 in an LTE network architecture. eNBs 204 and/or 208 may determine a type of traffic to be exchanged between one or more of the UEs 206 and the eNBs. In one reference example, eNB 208 may determine that a session established between the eNB 208 and UE 206 is for the exchange of voice traffic (or some other type of traffic). Similarly, eNB 204 may determine that a session established between eNB 204 and one or more of the UEs 206 is for the exchange of texting traffic (or some other type of traffic). The eNBs 204 and/or 208 may allocate resources for one or more of the UEs 206 to use for sending scheduling requests based on the type of traffic associated with each of the UEs 206. eNBs 204 and/or 208 may signal an indication of the allocated resources to each UE 206 (e.g., via radio resource control (RRC) signaling).

In FIG. 2, the access network 200 is divided into a number of cellular regions (cells) 202. One or more lower power class eNBs 208 may have cellular regions 210 that overlap with one or more of the cells 202. A lower power class eNB 208 may be referred to as a remote radio head (RRH). The lower power class eNB 208 may be a femto cell (e.g., home eNB (HeNB)), pico cell, or micro cell. The macro eNBs 204 are each assigned to a respective cell 202 and are configured to provide an access point to the EPC 110 for all the UEs 206 in the cells 202. There is no centralized controller in this example of an access network 200, but a centralized controller may be used in alternative configurations. The eNBs 204 are responsible for all radio related functions including radio bearer control, admission control, mobility control, scheduling, security, and connectivity to the serving gateway 116.

The modulation and multiple access scheme employed by the access network 200 may vary depending on the particular telecommunications standard being deployed. In LTE applications, OFDM is used on the DL and SC-FDMA is used on the UL to support both frequency division duplexing (FDD) and time division duplexing (TDD). As those skilled in the art will readily appreciate from the detailed description to follow, the various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. These concepts may also be extended to Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), Ultra Mobile Broadband (UMB), IEEE 802.11 (Wi-Fi), IEEE 802.16 (WiMAX), IEEE 802.20, and Flash-OFDM employing OFDMA. UTRA, E-UTRA, UMTS, LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

It is noted that while aspects may be described herein using terminology commonly associated with 3G and/or 4G wireless technologies, aspects of the present disclosure can be applied in other generation-based communication systems, such as 5G and later.

The eNBs 204 may have multiple antennas supporting MIMO technology. The use of MIMO technology enables the eNBs 204 to exploit the spatial domain to support spatial multiplexing, beamforming, and transmit diversity. Spatial multiplexing may be used to transmit different streams of data simultaneously on the same frequency. The data streams may be transmitted to a single UE 206 to increase the data rate or to multiple UEs 206 to increase the overall system capacity. This is achieved by spatially precoding each data stream (e.g., applying a scaling of an amplitude and a phase) and then transmitting each spatially precoded stream through multiple transmit antennas on the DL. The spatially precoded data streams arrive at the UE(s) 206 with different spatial signatures, which enables each of the UE(s) 206 to recover the one or more data streams destined for that UE 206. On the UL, each UE 206 transmits a spatially precoded data stream, which enables the eNB 204 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network will be described with reference to a MIMO system supporting OFDM on the DL. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM-symbol interference. The UL may use SC-FDMA in the form of a DFT-spread OFDM signal to compensate for high peak-to-average power ratio (PAPR).

Figure 3:
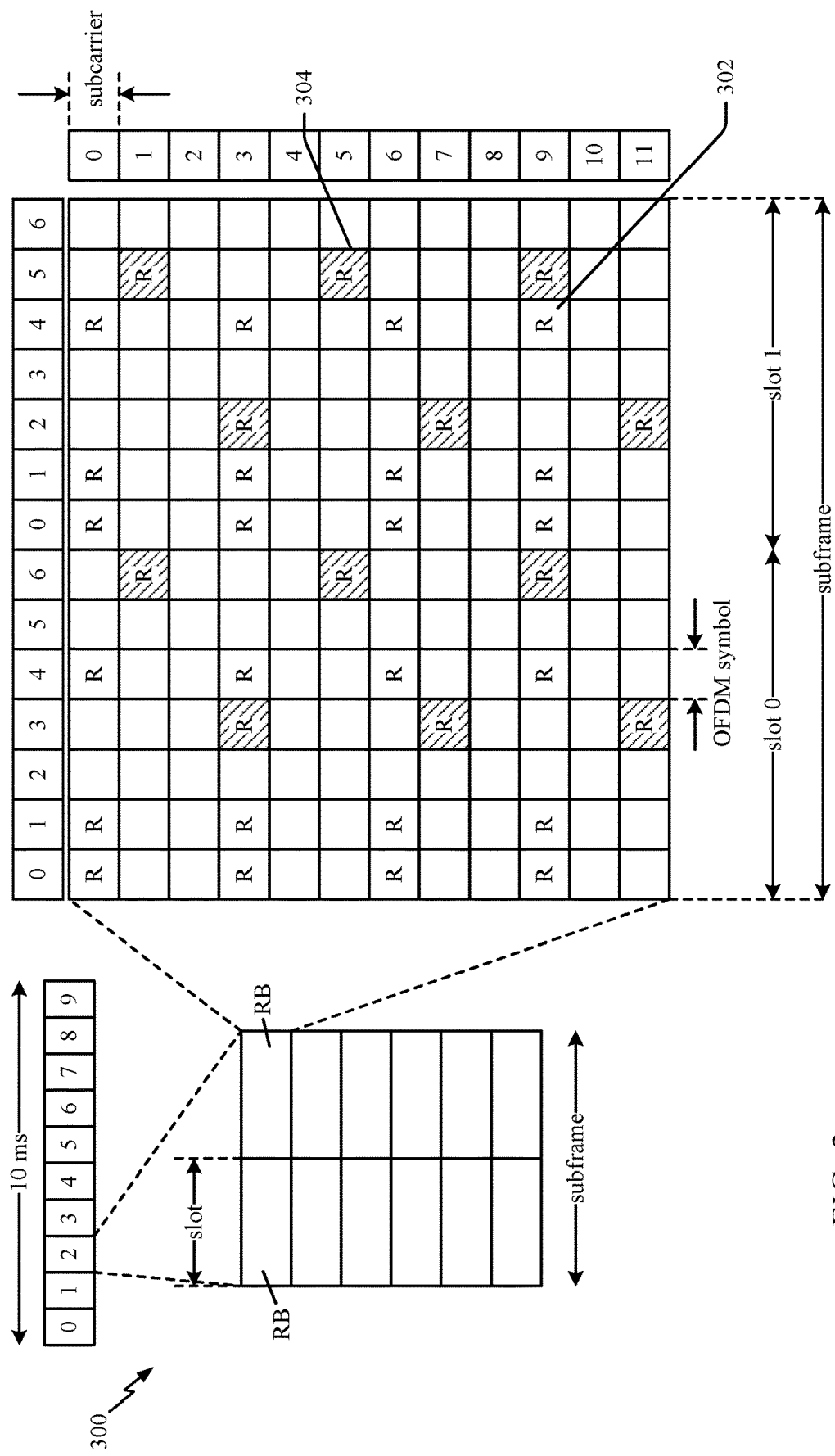
FIG. 3 is a diagram illustrating an example of a DL frame structure in LTE, in accordance with certain aspects of the disclosure.

FIG. 3 is a diagram 300 illustrating an example of a DL frame structure in LTE. A frame (10 ms) may be divided into 10 equally sized sub-frames with indices of 0 through 9. Each sub-frame may include two consecutive time slots. A resource grid may be used to represent two time slots, each time slot including a resource block. The resource grid is divided into multiple resource elements. In LTE, a resource block contains 12 consecutive subcarriers in the frequency domain and, for a normal cyclic prefix in each OFDM symbol, 7 consecutive OFDM symbols in the time domain, or 84 resource elements. For an extended cyclic prefix, a resource block contains 6 consecutive OFDM symbols in the time domain and has 72 resource elements. Some of the resource elements, as indicated as R 302, 304, include DL reference signals (DL-RS). The DL-RS include Cell-specific RS (CRS) (also sometimes called common RS) 302 and UE-specific RS (UE-RS) 304. UE-RS 304 are transmitted only on the resource blocks upon which the corresponding physical DL shared channel (PDSCH) is mapped. The number of bits carried by each resource element depends on the modulation scheme. Thus, the more resource blocks that a UE receives and the higher the modulation scheme, the higher the data rate for the UE.

In LTE, an eNB may send a primary synchronization signal (PSS) and a secondary synchronization signal (SSS) for each cell in the eNB. The primary and secondary synchronization signals may be sent in symbol periods 6 and 5, respectively, in each of subframes 0 and 5 of each radio frame with the normal cyclic prefix (CP). The synchronization signals may be used by UEs for cell detection and acquisition. The eNB may send a Physical Broadcast Channel (PBCH) in symbol periods 0 to 3 in slot 1 of subframe 0. The PBCH may carry certain system information.

The eNB may send a Physical Control Format Indicator Channel (PCFICH) in the first symbol period of each subframe. The PCFICH may convey the number of symbol periods (M) used for control channels, where M may be equal to 1, 2 or 3 and may change from subframe to subframe. M may also be equal to 4 for a small system bandwidth, e.g., with less than 10 resource blocks. The eNB may send a Physical HARQ Indicator Channel (PHICH) and a Physical Downlink Control Channel (PDCCH) in the first M symbol periods of each subframe. The PHICH may carry information to support hybrid automatic repeat request (HARQ). The PDCCH may carry information on resource allocation for UEs and control information for downlink channels. The eNB may send a Physical Downlink Shared Channel (PDSCH) in the remaining symbol periods of each subframe. The PDSCH may carry data for UEs scheduled for data transmission on the downlink.

The eNB may send the PSS, SSS, and PBCH in the center 1.08 MHz of the system bandwidth used by the eNB. The eNB may send the PCFICH and PHICH across the entire system bandwidth in each symbol period in which these channels are sent. The eNB may send the PDCCH to groups of UEs in certain portions of the system bandwidth. The eNB may send the PDSCH to specific UEs in specific portions of the system bandwidth. The eNB may send the PSS, SSS, PBCH, PCFICH, and PHICH in a broadcast manner to all UEs, may send the PDCCH in a unicast manner to specific UEs, and may also send the PDSCH in a unicast manner to specific UEs.

A number of resource elements may be available in each symbol period. Each resource element (RE) may cover one subcarrier in one symbol period and may be used to send one modulation symbol, which may be a real or complex value. Resource elements not used for a reference signal in each symbol period may be arranged into resource element groups (REGs). Each REG may include four resource elements in one symbol period. The PCFICH may occupy four REGs, which may be spaced approximately equally across frequency, in symbol period 0. The PHICH may occupy three REGs, which may be spread across frequency, in one or more configurable symbol periods. For example, the three REGs for the PHICH may all belong in symbol period 0 or may be spread in symbol periods 0, 1, and 2. The PDCCH may occupy 9, 18, 36, or 72 REGs, which may be selected from the available REGs, in the first M symbol periods, for example. Only certain combinations of REGs may be allowed for the PDCCH.

A UE may know the specific REGs used for the PHICH and the PCFICH. The UE may search different combinations of REGs for the PDCCH. The number of combinations to search is typically less than the number of allowed combinations for the PDCCH. An eNB may send the PDCCH to the UE in any of the combinations that the UE will search.

Figure 4:
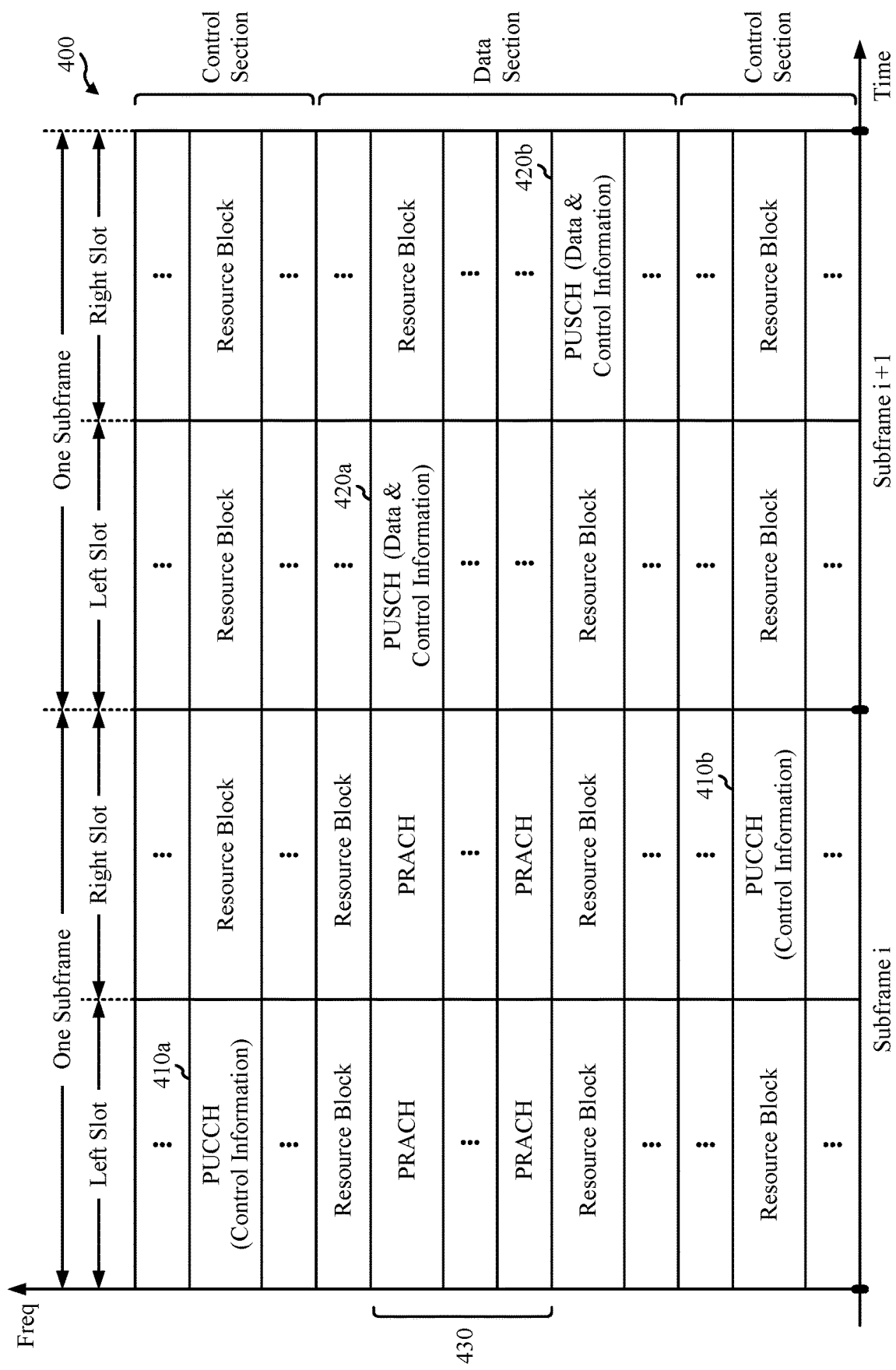
FIG. 4 is a diagram illustrating an example of an UL frame structure in LTE, in accordance with certain aspects of the disclosure.

FIG. 4 is a diagram 400 illustrating an example of an UL frame structure in LTE. The available resource blocks for the UL may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The UL frame structure results in the data section including contiguous subcarriers, which may allow a single UE to be assigned all of the contiguous subcarriers in the data section.

A UE may be assigned resource blocks 410a, 410b in the control section to transmit control information to an eNB. The UE may also be assigned resource blocks 420a, 420b in the data section to transmit data to the eNB. The UE may transmit control information (e.g., such as a scheduling request, etc.) in a physical UL control channel (PUCCH) on the assigned resource blocks in the control section. The UE may transmit only data or both data and control information in a physical UL shared channel (PUSCH) on the assigned resource blocks in the data section. A UL transmission may span both slots of a subframe and may hop across frequency.

A set of resource blocks may be used to perform initial system access and achieve UL synchronization in a physical random access channel (PRACH) 430. The PRACH 430 carries a random sequence and cannot carry any UL data/signaling. Each random access preamble occupies a bandwidth corresponding to six consecutive resource blocks. The starting frequency is specified by the network. That is, the transmission of the random access preamble is restricted to certain time and frequency resources. There is no frequency hopping for the PRACH. The PRACH attempt is carried in a single subframe (1 ms) or in a sequence of few contiguous subframes and a UE can make only a single PRACH attempt per frame (10 ms).

Figure 5:
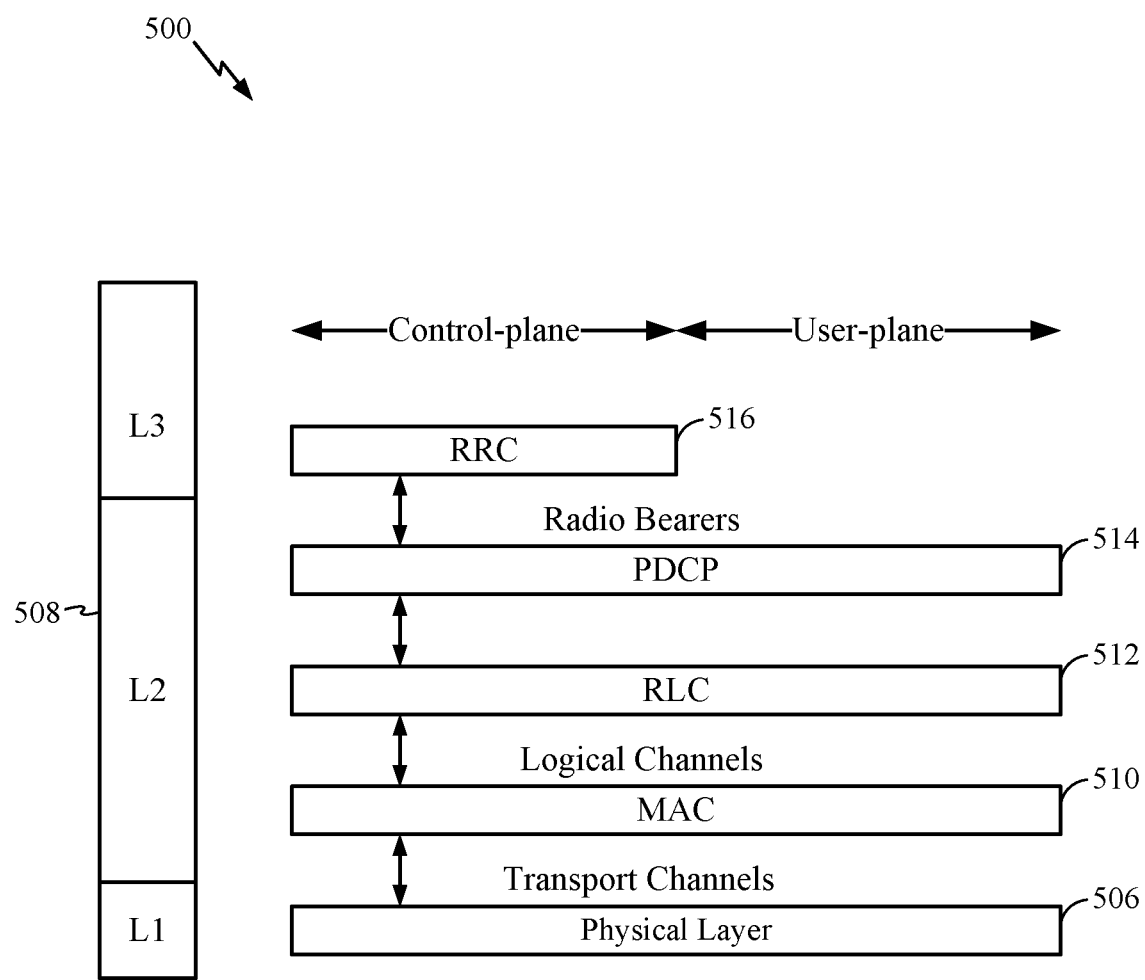
FIG. 5 is a diagram illustrating an example of a radio protocol architecture for the user and control plane, in accordance with certain aspects of the disclosure.

FIG. 5 is a diagram 500 illustrating an example of a radio protocol architecture for the user and control planes in LTE. The radio protocol architecture for the UE and the eNB is shown with three layers: Layer 1, Layer 2, and Layer 3. Layer 1 (L1 layer) is the lowest layer and implements various physical layer signal processing functions. The L1 layer will be referred to herein as the physical layer 506. Layer 2 (L2 layer) 508 is above the physical layer 506 and is responsible for the link between the UE and eNB over the physical layer 506.

In the user plane, the L2 layer 508 includes a media access control (MAC) sublayer 510, a radio link control (RLC) sublayer 512, and a packet data convergence protocol (PDCP) 514 sublayer, which are terminated at the eNB on the network side. Although not shown, the UE may have several upper layers above the L2 layer 508 including a network layer (e.g., IP layer) that is terminated at the PDN gateway 118 on the network side, and an application layer that is terminated at the other end of the connection (e.g., far end UE, server, etc.).

The PDCP sublayer 514 provides multiplexing between different radio bearers and logical channels. The PDCP sublayer 514 also provides header compression for upper layer data packets to reduce radio transmission overhead, security by ciphering the data packets, and handover support for UEs between eNBs. The RLC sublayer 512 provides segmentation and reassembly of upper layer data packets, retransmission of lost data packets, and reordering of data packets to compensate for out-of-order reception due to hybrid automatic repeat request (HARQ). The MAC sublayer 510 provides multiplexing between logical and transport channels. The MAC sublayer 510 is also responsible for allocating the various radio resources (e.g., resource blocks) in one cell among the UEs. The MAC sublayer 510 is also responsible for HARQ operations.

In the control plane, the radio protocol architecture for the UE and eNB is substantially the same for the physical layer 506 and the L2 layer 508 with the exception that there is no header compression function for the control plane. The control plane also includes a RRC sublayer 516 in Layer 3 (L3 layer). The RRC sublayer 516 is responsible for obtaining radio resources (i.e., radio bearers) and for configuring the lower layers using RRC signaling between the eNB and the UE.

Figure 6:
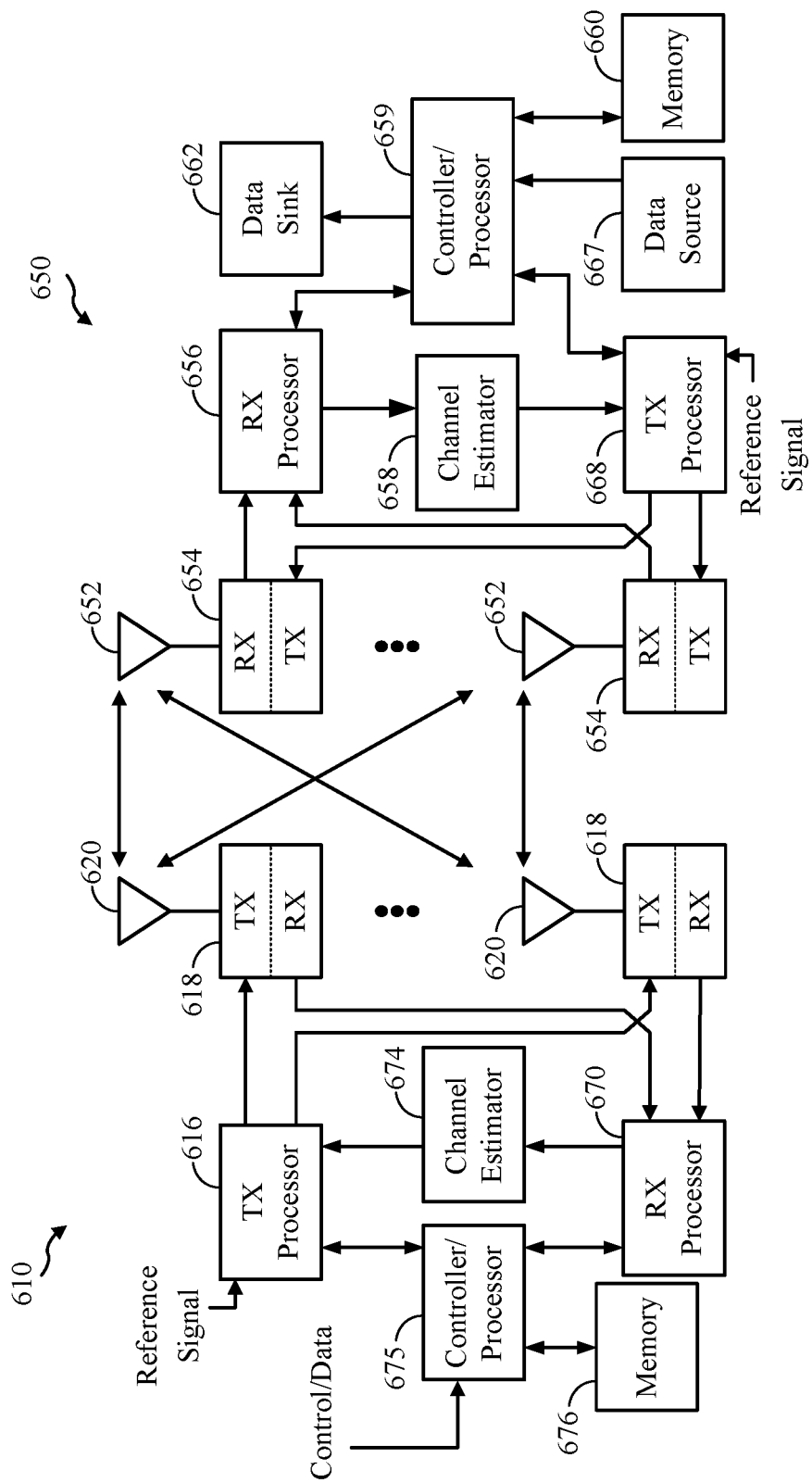
FIG. 6 is a diagram illustrating an example of an evolved Node B and user equipment in an access network, in accordance with certain aspects of the disclosure.

FIG. 6 is a block diagram of an eNB 610 in communication with a UE 650 in an access network. The eNBs of FIGS. 1 and 2 may include one or more components of eNB 610 illustrated in FIG. 6. Similarly, the UEs illustrated in FIGS. 1 and 2 may include one or more components of UE 650 as illustrated in FIG. 6. The eNB 610 and UE 650 may be configured to perform one or more of the techniques described herein.

In the DL, upper layer packets from the core network are provided to a controller/processor 675. The controller/processor 675 implements the functionality of the L2 layer. In the DL, the controller/processor 675 provides header compression, ciphering, packet segmentation and reordering, multiplexing between logical and transport channels, and radio resource allocations to the UE 650 based on various priority metrics. The controller/processor 675 is also responsible for HARQ operations, retransmission of lost packets, and signaling to the UE 650.

The TX processor 616 implements various signal processing functions for the L1 layer (i.e., physical layer). The signal processing functions includes coding and interleaving to facilitate forward error correction (FEC) at the UE 650 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 674 may be used to determine the coding and modulation scheme, as well as for spatial processing. The channel estimate may be derived from a reference signal and/or channel condition feedback transmitted by the UE 650. Each spatial stream is then provided to a different antenna 620 via a separate transmitter 618TX. Each transmitter 618TX modulates an RF carrier with a respective spatial stream for transmission.

At the UE 650, each receiver 654RX receives a signal through its respective antenna 652. Each receiver 654RX may include one or more baseband (BB) filters and one or more phase-locked loops (PLL). The BB filters may be analog or digital filters and act to filter out unwanted frequencies from received radio waves. The PLL helps the receiver to match the frequency of a desired signal and to demodulate the signal. Each receiver 654RX recovers information modulated onto an RF carrier and provides the information to the receiver (RX) processor 656. The RX processor 656 implements various signal processing functions of the L1 layer. The RX processor 656 performs spatial processing on the information to recover any spatial streams destined for the UE 650. If multiple spatial streams are destined for the UE 650, they may be combined by the RX processor 656 into a single OFDM symbol stream. The RX processor 656 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, is recovered and demodulated by determining the most likely signal constellation points transmitted by the eNB 610. These soft decisions may be based on channel estimates computed by the channel estimator 658. The soft decisions are then decoded and deinterleaved to recover the data and control signals that were originally transmitted by the eNB 610 on the physical channel. The data and control signals are then provided to the controller/processor 659.

The controller/processor 659 implements the L2 layer. The controller/processor can be associated with a memory 660 that stores program codes and data. The memory 660 may be referred to as a computer-readable medium. In the UL, the control/processor 659 provides demultiplexing between transport and logical channels, packet reassembly, deciphering, header decompression, control signal processing to recover upper layer packets from the core network. The upper layer packets are then provided to a data sink 662, which represents all the protocol layers above the L2 layer. Various control signals may also be provided to the data sink 662 for L3 processing. The controller/processor 659 is also responsible for error detection using an acknowledgement (ACK) and/or negative acknowledgement (NACK) protocol to support HARQ operations.

In the UL, a data source 667 is used to provide upper layer packets to the controller/processor 659. The data source 667 represents all protocol layers above the L2 layer. Similar to the functionality described in connection with the DL transmission by the eNB 610, the controller/processor 659 implements the L2 layer for the user plane and the control plane by providing header compression, ciphering, packet segmentation and reordering, and multiplexing between logical and transport channels based on radio resource allocations by the eNB 610. The controller/processor 659 is also responsible for HARQ operations, retransmission of lost packets, and signaling to the eNB 610.

Channel estimates derived by a channel estimator 658 from a reference signal or feedback transmitted by the eNB 610 may be used by the TX processor 668 to select the appropriate coding and modulation schemes, and to facilitate spatial processing. The spatial streams generated by the TX processor 668 are provided to different antenna 652 via separate transmitters 654TX. Each transmitter 654TX modulates an RF carrier with a respective spatial stream for transmission.

The UL transmission is processed at the eNB 610 in a manner similar to that described in connection with the receiver function at the UE 650. Each receiver 618RX receives a signal through its respective antenna 620. Each receiver 618RX recovers information modulated onto an RF carrier and provides the information to a RX processor 670. The RX processor 670 may implement the L1 layer.

The controller/processor 675 implements the L2 layer. The controller/processor 675 can be associated with a memory 676 that stores program codes and data. The memory 676 may be referred to as a computer-readable medium. In the UL, the control/processor 675 provides demultiplexing between transport and logical channels, packet reassembly, deciphering, header decompression, control signal processing to recover upper layer packets from the UE 650. Upper layer packets from the controller/processor 675 may be provided to the core network. The controller/processor 675 is also responsible for error detection using an ACK and/or NACK protocol to support HARQ operations.

The controller/processor 675 may direct the operation at the eNB 610. For example, the controller/processor 675 and/or other processors, components, and/or modules at the eNB 610 may perform or direct operations 700 illustrated in FIG. 7 and/or other processes or operations performed by the eNB as described herein. The controller/processor 659 may direct the operations at the UE 650. For example, the controller/processor 659 and/or other processors, components, and/or modules at the UE 650 may perform or direct operations 800 illustrated in FIG. 8 and/or other processes or operations performed by the UE as described herein.

Example Scheduling Request in LTE

In LTE networks, an eNB generally configures a UE with a scheduling request configuration (via RRC signaling) in order for the UE to transmit a scheduling request on a control channel (e.g., PUSCH). The UE may transmit such scheduling request to request radio resources (e.g., PUSCH resources) for an uplink transmission(s). The transmission of the scheduling request may be triggered when the UE has uplink data to transmit. For example, the UE's MAC layer may trigger the transmission of a scheduling request when a regular buffer status report (BSR) is triggered and the UE does not have uplink resources for transmission of at least the regular BSR. The regular BSR may be triggered when uplink data for a logical channel becomes available for transmission. Such BSR may indicate information about the amount of pending data in the uplink buffer of the UE.

Once the eNB receives the scheduling request transmitted by a UE, the eNB may send a grant for the uplink transmission(s) (e.g., downlink control information (DCI) format 0). In response to the grant, the UE may send uplink data (e.g., PUSCH) to the eNB. In general, the (transmission/reception) timing among scheduling request, uplink grant, PUSCH, etc. may vary depending on whether FDD or TDD is employed.

Example Resource Allocation for Traffic Profile Dependent Scheduling Request

In general, the focus for the design of next generation wide-band communication networks (e.g., such as 5G and later) is on supporting high reliability, low latency communications for users. For example, such next generation networks may support different traffic profiles for different applications. In particular, some of these applications may involve the exchange of high priority (e.g., high reliability, low latency) traffic. Such next generation networks may impose different and/or additional standards (as compared to earlier generation networks, such as 3G, 4G, etc.) regarding the scheduling of uplink transmissions in the network. Using a 5G network as a reference example, eNBs (or gNBs) in these networks may have to schedule a UE's uplink transmission(s) based on packet-wise deadline, channel condition, buffer status, etc. in very timely manner. As a result, uplink transmission scheduling in these networks may entail a significantly larger amount of control signaling.

eNBs, however, may not be able to receive additional scheduling information with traditional scheduling requests, as these scheduling requests are generally single bit traffic indicators. Accordingly, it may be desirable to allow UEs to convey additional scheduling information to eNBs.

Aspects presented herein provide techniques that allow UEs to convey additional scheduling information (e.g., in addition to a traffic indication within a scheduling request) to eNBs that the eNBs may use to determine how to assign resources for UE uplink transmissions. As described below, in one aspect, the eNB may assign resources for UEs to send scheduling requests based, in part, on a traffic profile for each UE. Note that the techniques described herein can be applied in a FDD system and/or TDD system. That is, the traffic profile dependent scheduling request (SR) sent by the UE can be applied in FDD uplink and/or TDD uplink.

Figure 7:
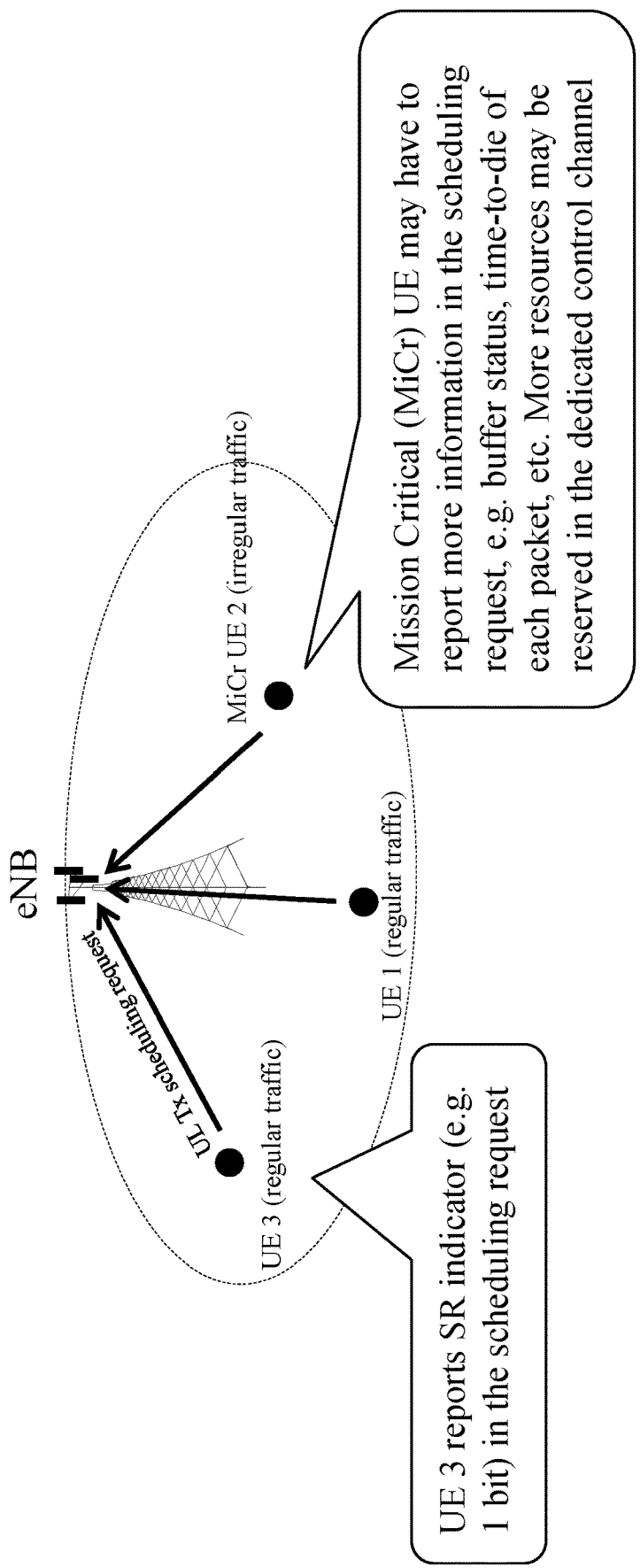
FIG. 7 illustrates an example of assigning resources for scheduling requests based on a traffic profile associated with UEs in a wireless communication system, in accordance with certain aspects of the present disclosure.

FIG. 7 illustrates an example network in which an eNB assigns resources for scheduling requests based on a traffic profile associated with UEs in the network, according to aspects of the present disclosure. The eNB in FIG. 7 may be any one of the eNBs illustrated in FIGS. 1, 2 and 6. Similarly, UEs 1-3 in FIG. 7 may be any one of the UEs illustrated in FIGS. 1, 2 and 6.

According to certain aspects, the eNB may determine a type of traffic to be exchanged between each of UEs 1-3 and the eNB. As shown in this example, UE 1 may have regular traffic (e.g., voice traffic, etc.) to send to the eNB, UE 2 may have mission critical traffic (e.g., Voice-over-LTE traffic, or other traffic that requires high reliability and/or low latency) to send to the eNB, and UE 3 may have regular traffic (e.g., texting traffic, etc.) to send to the eNB. Based on the type of traffic that is associated with a given UE, the eNB may determine that additional information is needed in order to assign resources for an uplink transmission. For example, since UE 2 has to send high priority (or mission critical) traffic, the eNB may determine that UE 2 needs to report more information in its scheduling request in order for the eNB to adequately support the high priority traffic. The eNB, therefore, as described below, may take action to reserve more resources in the dedicated control channel for UE 2 to provide more information in its scheduling request.

The traffic types described with respect to FIG. 7 are provided merely as reference examples of the types of traffic that may be exchanged between a UE and an eNB. In general, the types of traffic may include any of voice traffic, texting traffic, video traffic, regular and irregular mission critical (i.e., high reliability and low latency) traffic or other traffic defined by latency or other quality of service (QoS) aspects, low power requirements for the UE, and/or a content type, e.g., Multimedia Broadcast Multicast Service (MBMS).

The eNB may determine the type of traffic associated with each UE based on the data session that is established between each of the UEs 1-3 and the eNB. For example, the eNB may determine the type of traffic to be exchanged based on the bearers (e.g., default bearers, dedicated bearers, etc.) that are set up as part of the data session. The eNB may determine whether the data session is an internet protocol (IP) session (e.g., carrying Ethernet packet data units (PDUs), etc.) or non-IP session (e.g., carrying unstructured data PDUs), depending on the type of data that is transported.

In certain aspects, the eNB may configure each of the UEs 1-3 with a scheduling request configuration in order for the UE to transmit the scheduling request in the dedicated control channel. The scheduling request configuration that is assigned to each UE 1-3 may be dependent on the respective UE's traffic profile. Put differently, the eNB may allocate resources for each of UEs 1-3 to use for sending a scheduling request based on the type of traffic associated with each of UEs 1-3.

Figure 8:
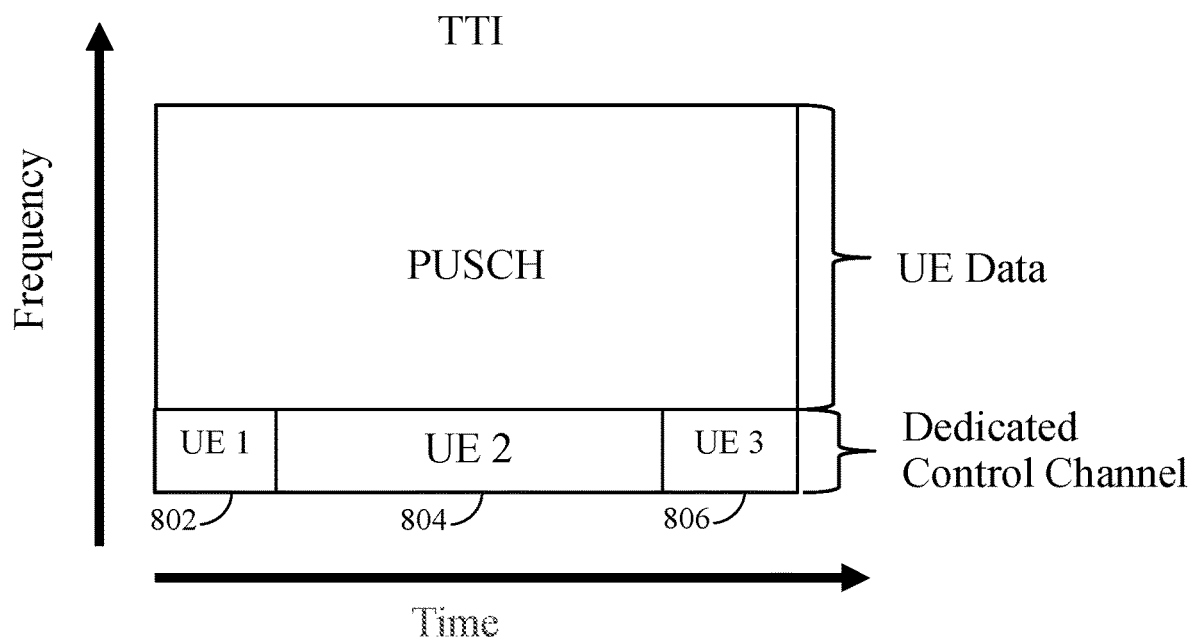
FIG. 8 illustrates an example resource allocation for scheduling requests in a control channel, in accordance with certain aspects of the present disclosure.

FIG. 8, for example, illustrates one reference example of a scheduling request resource allocation that may be assigned to the UEs 1-3 based on their respective traffic profiles. As shown in FIG. 8, the eNB may assign resources 802 to UE 1, resources 804 to UE 2 and resources 806 to UE 3. In this example, the eNB may allocate more resources (resource blocks (RBs) to UE 2 (compared to UEs 1 and 3) because UE 2 has high priority traffic to be sent to the eNB.

The UEs may determine the type of information to include in the scheduling request based on their traffic profile and/or the amount of their allocated resources. For example, UEs 1 and 3 may include a single bit traffic indicator as UEs 1 and 3 may not have enough resources assigned by the eNB to include additional information regarding their uplink transmissions. On the other hand, UE 2 may use its additional resources to report additional information (e.g., in addition to a traffic request indicator) regarding its uplink transmission, e.g., such as a buffer status, time-to-die of each packet, service priority of each packet, size of each packet, etc. In some aspects, the scheduling request information can be conveyed in a quantized manner.

Referring back to FIG. 7, once the eNB determines the scheduling request configuration for each UE 1-3, the eNB may signal an indication of the allocated resources to each UE 1-3. In some aspects, the signaling may include signaling an indication of all the resources allocated in the dedicated control channel to each UE. For example, in this case, the eNB would signal an indication of resources 802-806 to each of UEs 1-3. In some aspects, the signaling may include signaling, for each of the UEs, the resources allocated to that UE for sending a scheduling request. For example, in this case, the eNB would signal an indication of resources 802 to UE 1, an indication of resources 804 to UE 2, and an indication of resources 803 to UE 3. The eNB may provide an indication of the resources to the UEs via RRC signaling (or other type of signaling).

According to certain aspects, the eNB may adjust the allocated resources for each UE to send a scheduling request based on a change in the type of traffic associated with each UE. Put differently, the assignment of resources for each UE can be time-varying with respect to the dynamics of any given UE's traffic profile. For example, in some cases, the eNB may determine that the mission critical traffic associated with UE 2 is irregular (and therefore does not occur often). In such a case, the eNB may allocate a smaller amount of resources (compared to resources 804) for the UE 2 to send a scheduling request for the majority of time that UE 2 is active.

Once the eNB signals an indication of the scheduling request resources allocated to each UE, the eNB may receive, from each UE, a scheduling request on the allocated resources. The eNB may use the information within each scheduling request to allocate resources for each UE to send an uplink transmission. As noted above, in some cases, the information within the scheduling request may include a single bit requesting resources for the uplink transmission. In some cases, the scheduling request may include one or more additional bits specifying additional information regarding the uplink transmission. Providing additional information within scheduling requests, in this manner, may allow eNBs to more efficiently schedule resources to meet demands of high priority traffic in the communication network.

Figure 9:
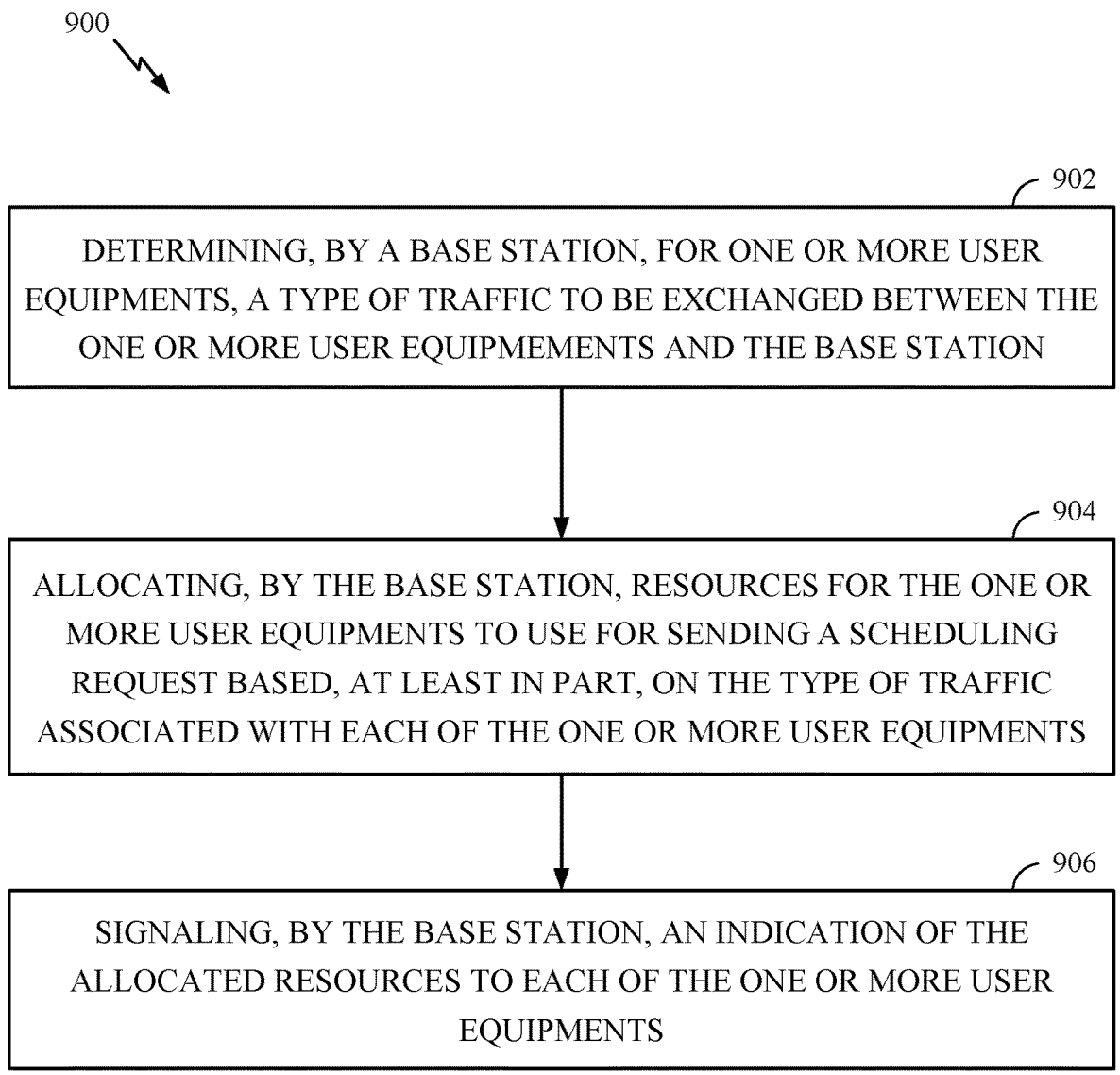
FIG. 9 illustrates example operations 900 for wireless communications by a base station, in accordance with certain aspects of the present disclosure.

FIG. 9 illustrates example operations 900 which may be performed by a base station, according to aspects of the present disclosure. For example, eNBs 106, 108 of FIG. 1 and/or eNB 204, 208 of FIG. 2, which may include one or more components and/or modules of eNB 610 of FIG. 6 may perform the operations 700. According to aspects, the controller/processor 675, memory 676, and/or Tx/Rx 618 may perform aspects described herein.

At 902, the base station determines, for one or more UEs, a type of traffic to be exchanged between the one or more UEs and the base station. At 904, the base station allocates resources for the one or more UEs to use for sending a scheduling request based, at least in part, on the type of traffic associated with each of the one or more UEs. At 906, the base station signals an indication of the allocated resources to each of the one or more UEs.

Figure 10:
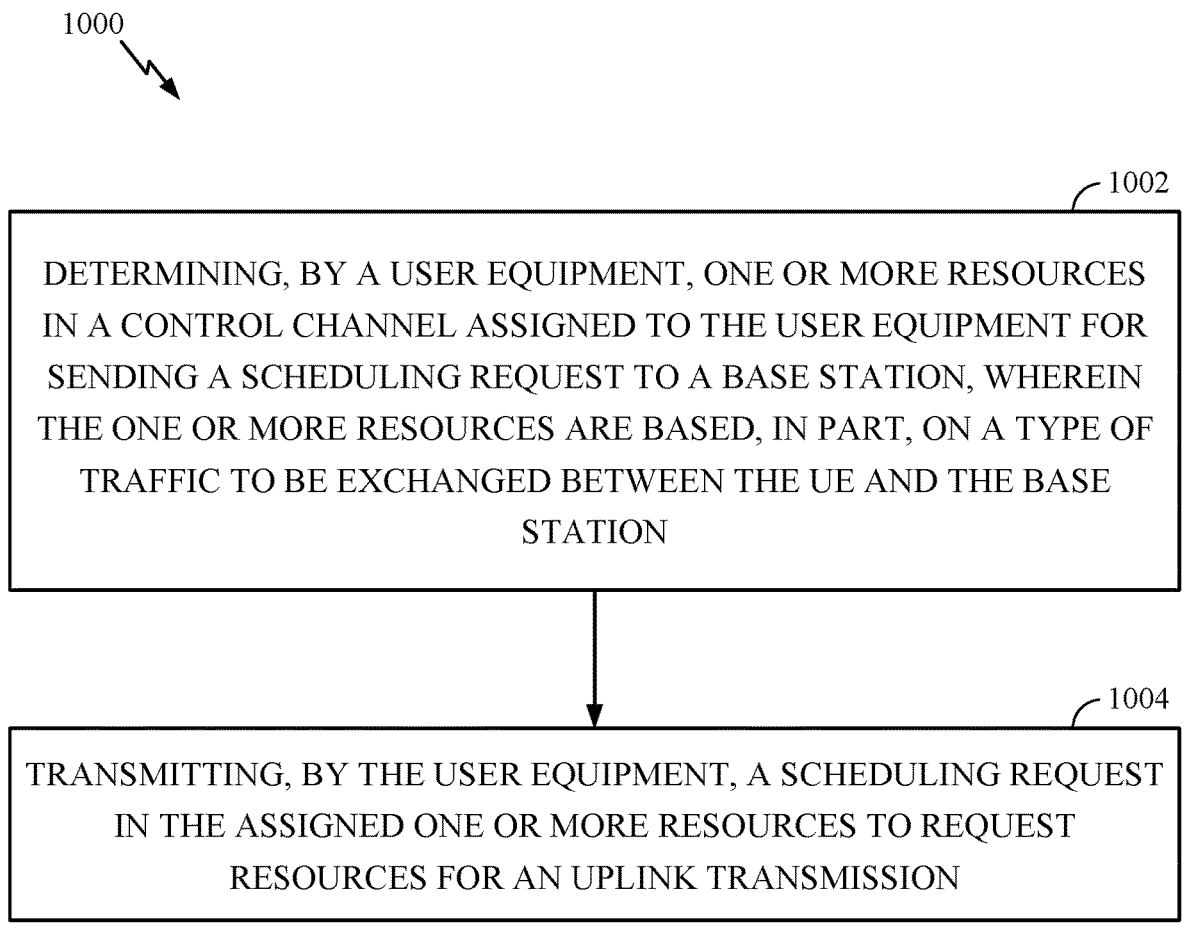
FIG. 10 illustrates example operations 1000 for wireless communications by a user equipment, in accordance with certain aspects of the present disclosure.

FIG. 10 illustrates example operations 1000 which may be performed by a UE, according to aspects of the present disclosure. For example, UE 102 of FIG. 1, and/or UE 206 of FIG. 2, which may include one or more components and/or modules of UE 650 of FIG. 6 may perform the operations 800. According to aspects, the controller/processor 659, memory 660, and/or Tx/Rx 654 may perform aspects described herein.

At 1002, the UE determines one or more resources in a control channel assigned to the UE for sending a scheduling request to a base station, wherein the one or more resources are based, in part, on a type of traffic to be exchanged between the UE and the base station. At 1004, the UE transmits a scheduling request in the assigned one or more resources to request resources for an uplink transmission.

Advantageously, the techniques presented herein allow eNBs to more efficiently schedule uplink resources for high demand, high capacity traffic that may be exchanged in a wireless communication network, e.g., by providing eNBs with the flexibility to determine when to allocate additional resources to UEs to send scheduling requests.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, b-b, b-b-b, b-b-c, c-c, and c-c-c or any other ordering of a, b, and c). Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the term "identifying" encompasses a wide variety of actions. For example, "identifying" may include calculating, computing, processing, deriving, determining, investigating, looking up (e.g., looking up in a table, a database or another data structure), ascertaining and the like. Also, "identifying" may include receiving (e.g., receiving information), accessing (e.g., accessing data in a memory) and the like. Also, "identifying" may include resolving, selecting, choosing, establishing and the like.

In some cases, rather than actually communicating a frame, a device may have an interface to communicate a frame for transmission or reception. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in Figures, those operations may be performed by any suitable corresponding counterpart means-plus-function components.

For example, means for determining, means for performing, means for selecting, means for allocating, means for identifying, means for transmitting, means for receiving, means for sending, means for adjusting, means for scheduling, means for transmitting, means for monitoring, means for signaling, and/or means for communicating may include one or more processors or other elements, such as the transmit processor 668, the controller/processor 659, the receive processor 656, and/or antenna(s) 652 of the user equipment 650 illustrated in FIG. 6, and/or the transmit processor 616, the controller/processor 675, and/or antenna(s) 620 of the base station 610 illustrated in FIG. 6.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or combinations thereof.

Those of skill would further appreciate that the various illustrative logical blocks, modules, circuits, and algorithm steps described in connection with the disclosure herein may be implemented as hardware, software, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The steps of a method or algorithm described in connection with the disclosure herein may be embodied directly in hardware, in a software module executed by a processor, or in a combination thereof. A software module may reside in RAM memory, flash memory, ROM memory, EPROM memory, EEPROM memory, phase change memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, or combinations thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD/DVD or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of wireless communication by a base station (BS), comprising:
   determining, for one or more user equipments (UEs), a type of traffic to be exchanged between the one or more UEs and the BS;
   allocating resources for the one or more UEs to use for sending a scheduling request based, at least in part, on the type of traffic associated with each of the one or more UEs;
   signaling an indication of the allocated resources to each of the one or more UEs; and
   receiving a scheduling request from at least one of the one or more UEs on the allocated resources, wherein:
   at least one of the received scheduling requests comprises one bit requesting resources for an uplink transmission and a plurality of bits specifying additional information regarding the uplink transmission; and
   the additional information comprises a buffer status, a packet size, and a packet lifetime of the uplink transmission.

2. The method of claim 1, wherein the signaling comprises signaling, for each of the one or more UEs, the resources allocated to that UE for sending a scheduling request.

3. The method of claim 1, wherein the type of traffic comprises voice traffic, texting traffic, or high priority traffic.

4. The method of claim 1, wherein the signaling comprises signaling the indication of the allocated resources for all of the one or more UEs to each of the one or more UEs.

5. The method of claim 1, wherein the indication is provided via radio resource control (RRC) signaling.

6. The method of claim 1, wherein allocating the resources for the one or more UEs further comprises adjusting the allocated resources for the one or more UEs to send a scheduling request based, at least in part, on a change in the type of traffic associated with each of the one or more UEs.

7. The method of claim 1, wherein the additional information further comprises a service priority of the uplink transmission.

8. The method of claim 1, further comprising allocating resources for at least one of the one or more UEs to send an uplink transmission based, at least in part, on the additional information.

9. A method of wireless communication by a user equipment (UE), comprising:
 determining one or more resources in a control channel assigned to the UE for sending a scheduling request to a base station (BS), wherein the one or more resources are based, in part, on a type of traffic to be exchanged between the UE and the BS;
 determining a plurality of types of information for an uplink transmission to include in the scheduling request based, at least in part, on the type of traffic and an amount of the one or more resources; and
 transmitting a scheduling request in the assigned one or more resources to request resources for the uplink transmission, wherein:
  the scheduling request comprises one bit for requesting the resources for the uplink transmission and additional bits comprising the plurality of types of information; and
  the plurality of types of information comprise a buffer status, a packet size, and a packet lifetime of the uplink transmission.

10. The method of claim 9, wherein the plurality of types of information further comprise a service priority of the uplink transmission.

11. The method of claim 9, further comprising after transmitting the scheduling request, receiving resources for the uplink transmission based, in part, on the plurality of types of information.

12. The method of claim 9, wherein the determination of the one or more resources assigned to the UE is based on signaling from the BS indicating the one or more resources.

13. The method of claim 12, wherein the indication of the one or more resources is received via radio resource control (RRC) signaling.

14. The method of claim 9, wherein the one or more resources assigned to the UE are adjusted based, in part, on a change in the type of traffic associated with the UE.

15. An apparatus for wireless communication, comprising:
 means for determining, for one or more user equipments (UEs), a type of traffic to be exchanged between the one or more UEs and the apparatus;
 means for allocating resources for the one or more UEs to use for sending a scheduling request based, at least in part, on the type of traffic associated with each of the one or more UEs;
 means for signaling an indication of the allocated resources to each of the one or more UEs; and
 means for receiving a scheduling request from at least one of the one or more UEs on the allocated resources, wherein:
  at least one of the received scheduling requests comprises one bit requesting resources for an uplink transmission and a plurality of bits specifying additional information regarding the uplink transmission; and
  the additional information comprises a buffer status, a packet size, and a packet lifetime of the uplink transmission.

16. The apparatus of claim 15, wherein the means for signaling signals, for each of the one or more UEs, the resources allocated to that UE for sending a scheduling request.

17. The apparatus of claim 15, wherein the type of traffic comprises voice traffic, texting traffic, or high priority traffic.

18. The apparatus of claim 15, wherein the means for signaling signals the indication of the allocated resources for all of the one or more UEs to each of the one or more UEs.

19. The apparatus of claim 15, wherein means for allocating the resources for the one or more UEs further comprises means for adjusting the allocated resources for the one or more UEs to send a scheduling request based, at least in part, on a change in the type of traffic associated with each of the one or more UEs.

20. The apparatus of claim 15, wherein the additional information further comprises a service priority of the uplink transmission.

21. The apparatus of claim 15, further comprising means for allocating resources for at least one of the one or more UEs to send an uplink transmission based, at least in part, on the additional information.

22. An apparatus for wireless communication, comprising:
 means for determining one or more resources in a control channel assigned to the apparatus for sending a scheduling request to a base station (BS), wherein the one or more resources are based, in part, on a type of traffic to be exchanged between the apparatus and the BS;
 means for determining a plurality of types of information for an uplink transmission to include in the scheduling request based, at least in part, on the type of traffic and an amount of the one or more resources; and
 means for transmitting a scheduling request in the assigned one or more resources to request resources for the uplink transmission, wherein:
  the scheduling request comprises one bit for requesting the resources for the uplink transmission and additional bits comprising the plurality of types of information; and
  the plurality of types of information comprise a buffer status, a packet size, and a packet lifetime of the uplink transmission.

23. The apparatus of claim 22, wherein the plurality of types of information further comprise a service priority of the uplink transmission.

24. The apparatus of claim 22, further comprising after transmitting the scheduling request, means for receiving resources for the uplink transmission based, in part, on the plurality of types of information.

* * * * *